Feb. 24, 1970 E. F. KRISS ET AL 3,497,823
VARIABLE IMPEDANCE CIRCUIT
Filed Nov. 3, 1967
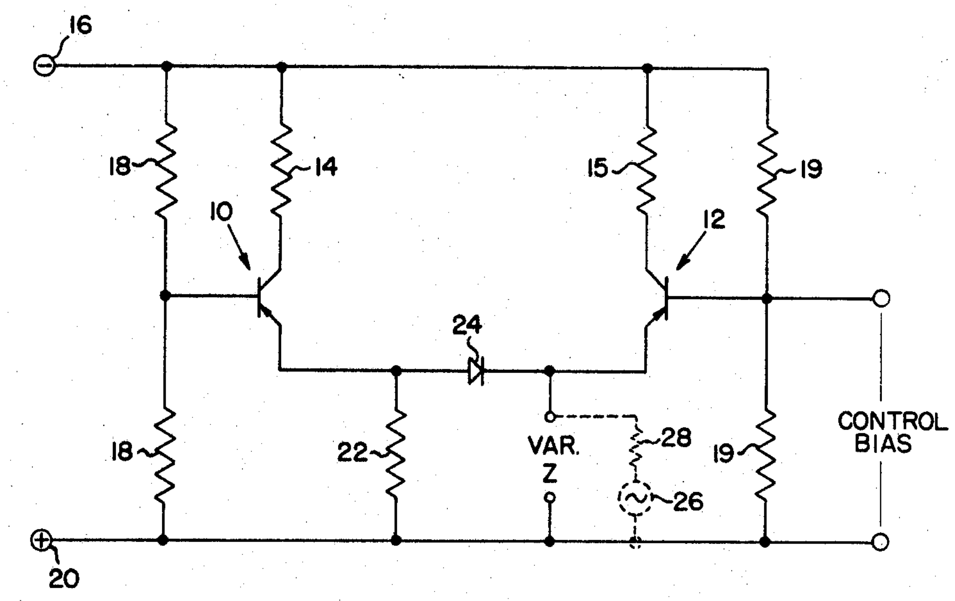
INVENTORS
FRANK NIERTIT
BERNARD H. ROOT
EDWARD F. KRISS
BY
ATTORNEY United States Patent Office 3,497,823
Patented Feb. 24, 1970

3,497,823
VARIABLE IMPEDANCE CIRCUIT

Edward F. Kriss, Saugerties, Frank Niertit, West Webster, and Bernard H. Root, Palmyra, N.Y., assignors to Stromberg-Carlson Corporation, Rochester, N.Y., a corporation of Delaware Filed Nov. 3, 1967, Ser. No. 680,401
Int. Cl. H03g 3/30
U.S. Cl. 330—29 4 Claims

ABSTRACT OF THE DISCLOSURE

A variable impedance circuit for signal compression or the like including a transistor, a diode connected in series with the emitter of the transistor, and means for biasing the transistor. A signal to be compressed is applied between the emitter and a point of reference potential. The parallel combination of the diode and the emitter constitutes the variable impedance, and because of the amplification factor of the transistor, the dynamic impedance is very low so that operation of the circuit at any bias setting is restricted to small portions of the characteristic curves of the transistor and the diode, thus minimizing signal distortion. As an added feature, the biasing means includes a second transistor connected with the first one in a differential amplifier arrangement to stabilize the circuit against variations in ambient conditions.

Brief summary of the invention

This invention relates to a novel electrical circuit for producing a variable impedance effect for signal compression and the like, and, more particularly, to a circuit of this type including means for minimizing signal distortion and maximizing response, and having a high degree of stability and immunity from the effects of variations in operation conditions.

Circuits for controllably varying the electrical impedance between a pair of terminals have a wide range of applications such as, for example, for use in automatic gain control of amplifiers, for automatic frequency control in radio receivers, and for signal compression.

It is known, for example, to connect a pair of diodes in series with each other in a voltage divider network through which a signal is fed to a stage of an amplifier to compress the signal by progressively attenuating it as it varies from a mean value. Circuits of this type are capable of only limited signal compression, and, more importantly, they distort the signal, especially at low values, because of the extremely non-linear characteristics of the diodes at small forward biasing voltages.

The circuit of the present invention provides a high degree of compensation for the non-linearity of the diode characteristic, and also enables the achievement of a higher degree of signal compression than heretofore possible in circuits of this general type. It also enables compensation for ambient variations in operation such as, for example, fluctuations in the voltage of the power supply.

Briefly, the circuit of the invention includes a transistor, a diode connected in series with the emitter of the transistor, means for biasing the transistor, and means for applying a signal between a point of reference potential and the emitter of the transistor. In effect, the signal "sees" the diode in parallel with the emitter junction of the transistor. Because of the amplification factor of the transistor, the response of the circuit to variations in the signal is enhanced, signal distortion is minimized, and a relatively high degree of signal compression may be achieved.

According to an additional feature of the invention, a second transistor is connected in parallel with the first transistor to form a differential circuit thereby to compensate for changes in ambient conditions, and to make the circuit highly stable in operation.

Detailed description

A presently preferred embodiment of the invention will now be described in connection with the accompanying drawing, wherein the single figure is a schematic circuit diagram of a variable impedance circuit in accordance with the invention.

As shown, the circuit includes two transistors 10 and 12, respectively, of the PNP conductivity type, connected in a differential amplifier configuration. The collectors of the transistors 10 and 12 are connected through separate load resistors 14 and 15 to the negative battery terminal 16. Their bases are connected to mid-points of separate voltage dividers 18 and 19, which are connected between the battery terminals 16 and 20. A common emitter resistor 22 is connected between the emitters of the transistors 10 and 12 and the positive battery terminal 20, and a diode 24 is connected between the emitter resistor 22 and the emitter of the second transistor 12.

The output of the circuit is constituted by the impedance of the diode and the emitter junction of the second transistor 12 taken in parallel. Typically, the circuit is connected as an element in a voltage divider network at the input of an amplifier stage (not shown) for progressively attenuating a signal as it varies from a mid-point value. For example, as indicated in dashed lines, a signal from a source 26 may be connected in series with a resistor 28 between the emitter of the second transistor 12 and the positive battery terminal 20. Only the portion of the signal that appears between the emittter and the positive battery terminal is then passed on to the desired utilization circuit.

The degree of signal compression produced by the circuit is controlled by the D.C. bias applied between the base of the transistor 12 and the positive battery terminal. Compression is increased as the transistor 12 is increasingly biased toward increasing conductivity. In operation, the transistor 12 is biased to render it conductive in the absence of a signal from the source 26, and, therefore, the diode 24 is also normally conductive.

The effective impedance presented by the circuit consists of the diode 24 in parallel with the emitter of the transistor 12, and, because of the amplification factor, $\beta$, of the transistor, the value of the dynamic impedance is low. As a result, the circuit operates over only a very small range of the characteristic curves of the diode 24 and the transistor 12, and produces minimum distortion of the signal.

Changes in the value of the static impedance, as measured between the emitter of the transistor 12 and the positive battery terminal 20 in the absence of a signal from the source 26, may be controllably varied from about 10,000 ohms to about 10 ohms by adjusting the bias currents applied to the transistors 10 and 12 in accordance with recognized principles.

The operation of the circuit is highly independent of ordinary variations in the voltage of the energizing source, and varies only slightly responsively to changes in the ambient temperatures. The circuit is symmetrical, and changes in the energizing voltage produce equal and compensating changes in both of the transistors 10 and 12. For similar reason, changes in temperature produce equal and opposite effects, which cancel each other insofar as the two transistors 10 and 12 are concerned. Changes in temperature will, however, have a slight effect due to changes in the characteristics of the diode 24, but for most applications, this effect will be well within tolerable limits.

What is claimed is:

1. A variable impedance circuit for use as a signal compressor or the like comprising a pair of transistors, a diode, circuit means connecting opposite ends of said diode in a direct current series circuit between the emitters of said transistors, means for biasing said transistors, and means for applying a signal to be compressed between the emitter of one of said transistors and a point of reference potential characterized in that the operation being such that the emitter of said one transistor in parallel with said diode constitutes a load for said applying means.

2. A varaible impedance circuit for use as a signal compressor or the like comprising a transistor, a diode, circuit means connecting one end of said diode in a direct current series circuit with the emitter of said transistor, means for biasing said transistor, biasing means connected to the other end of said diode for applying a temperature compensating bias to said diode, means for applying a signal to be attenuated between said series circuit and a point of reference potential, and means for controllably varying said means for biasing said transistor so that the impedance presented by said emitter and said diode is varied to attenuate said signal.

3. A variable impedance circuit for use as a signal compressor or the like comprising a transistor, a diode connected in a direct current series circuit with the emitter of said transistor and oriented for forward conduction in the same direction as said transistor, means for biasing said transistor, biasing means for providing a temperature compensating biasing potential for forward biasing said diode, and means for applying a signal to be compressed between the emitter of said transistor and a point of reference potential characterized in that the operation being such that the emitter of said transistor in parallel with said diode constitutes a load for said applying means.

4. A variable impedance circuit for use as a signal compressor or the like comprising a pair of transistors, means connecting said transistors in a differential amplifier configuration, said connecting means including a diode connected directly between the respective emitters of said transistors, means for controllably biasing said transistors, and means for applying a signal to be attenuated between a point of reference potential and the emitter of the one of said transistors that is oriented for conduction in the same direction as the forward direction of said diode.

References Cited

UNITED STATES PATENTS

| | | | |
|---|---|---|---|
| 3,177,439 | 4/1965 | Tulp et al. | 330—29 X |
| 2,870,271 | 1/1959 | Cronburg et al. | 330—29 X |
| 2,971,164 | 2/1961 | Saari | 350—145 |
| 3,115,601 | 12/1963 | Harris. | |
| 3,163,828 | 12/1964 | Fine | 330—29 X |

FOREIGN PATENTS

| | | | |
|---|---|---|---|
| 250,746 | 11/1960 | Australia. | |

ROY LAKE, Primary Examiner

JAMES B. MULLINS, Assistant Examiner

U.S. Cl. X.R.

330—30, 145